United States Patent
Marukawa (10) Patent No.: US 6,687,841 B1
(45) Date of Patent: Feb. 3, 2004

(54) WIDE FREQUENCY RANGE PLL CLOCK GENERATING CIRCUIT WITH DELTA SIGMA MODULATING CIRCUITRY FOR REDUCING THE TIME CHANGING RATIO OF THE INPUT VOLTAGE OF A VOLTAGE CONTROLLED OSCILLATOR

(75) Inventor: Shoji Marukawa, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/673,820

(22) PCT Filed: Feb. 22, 2000

(86) PCT No.: PCT/JP00/00981

§ 371 (c)(1),
(2), (4) Date: Dec. 12, 2000

(87) PCT Pub. No.: WO00/51122

PCT Pub. Date: Aug. 31, 2000

(30) Foreign Application Priority Data

Feb. 22, 1999 (JP) ............................................. 11/042742

(51) Int. Cl.⁷ .................................................. G06F 1/08
(52) U.S. Cl. ..................... 713/500; 713/501; 713/503
(58) Field of Search .................................. 713/500, 501, 713/503; 332/109, 112; 375/238, 239, 376

(56) References Cited

U.S. PATENT DOCUMENTS

| | | | |
|---|---|---|---|
| 5,157,355 A | * 10/1992 | Shikakura et al. | ............. 331/11 |
| 5,440,532 A | 8/1995 | Yokogawa et al. | |
| 5,712,635 A | 1/1998 | Wilson et al. | |
| 5,748,045 A | 5/1998 | Tateishi | |
| 5,802,123 A | 9/1998 | Yoshimura et al. | |
| 5,841,323 A | * 11/1998 | Fujimoto | ..................... 331/11 |

OTHER PUBLICATIONS

Patent Abstracts of Japan, publication No. 07078422, publication date Mar. 20, 1995.
Yada et al., A Novel Digital Signal Processing Bit Synchronizer for a PRML Recording Channel, Apr. 1993, pp. 84–94.
Stikvoort et al., An All–Digital Bit Detector for Compact Disc Players, Jan. 1992, pp. 191–200.

* cited by examiner

*Primary Examiner*—Thomas Lee
*Assistant Examiner*—Paul Yanchus, III
(74) *Attorney, Agent, or Firm*—Wenderoth, Lind & Ponack, L.L.P.

(57) ABSTRACT

A clock generation circuit of the present invention extracts a phase error signal of a digital signal obtained from a recording medium (1) by a phase comparator (4), filters the phase error signal by a loop filter (5). In a first embodiment it converts the signal into an analog signal by a minute control D/A converter (6), detects whether the signal is within a set range by a range detector (9), generates a modulation reference signal by a modulation reference signal generator (10), modulates the modulation reference signal by a pulse width modulator (11), adds a frequency set value and the modulation reference signal by an adder (12), converts the addition result into an analog signal by a rough control D/A converter (13), cuts high-band components of the analog signal by a low-pass filter (14), adds the analog signals output from the minute control D/A converter (6) and the low-pass filter (14) by an analog adder (7), and outputs a clock signal by a voltage controlled oscillator (8) on the basis of an output signal of the analog adder (7). Thereby, a clock signal which can continuously lock a wide frequency range can be generated. In a second embodiment the loop filter output is oversampled (15), then interpolated (16) and modulated by a multivalued delta sigma modulator.

3 Claims, 9 Drawing Sheets

WIDE FREQUENCY RANGE PLL CLOCK GENERATING CIRCUIT WITH DELTA SIGMA MODULATING CIRCUITRY FOR REDUCING THE TIME CHANGING RATIO OF THE INPUT VOLTAGE OF A VOLTAGE CONTROLLED OSCILLATOR

TECHNICAL FIELD

The present invention relates to a clock generation circuit for generating a clock signal which is used for reproducing a signal on a recording medium.

BACKGROUND ART

In recent years, a signal processing which is called PRML (partial response maximum likelihood) is increasingly introduced into data reproduction signal processings in digital recording and reproducing apparatus. In this data reproduction signal processing, signals are processed digitally and clock generation itself is also changing from a conventional analog PLL (phase locked loop) to a digital PLL. While the introduction of the PRML is advanced in HDDs (hard disk drives), the PRML has not been introduced into optical disk apparatuses yet. A clock generation circuit has no problem as long as it is used in the HDDs, but it has problems when used in optical disk apparatuses.

Disks like a CD (compact disk) or a DVD (digital versatile disk) are produced for CLV (constant linear velocity) reproduction use, but in reality they are reproduced also at CAV (constant angular velocity) or they require jitter-free reproduction for reading data before a spindle rotating speed reaches the CLV. Consequently, the CD or DVD requires a performance for executing the PLL continuously in a wider frequency range than that of the HDD.

For optical disks such as the CD or DVD, a binary discriminator with an analog comparator is used for data determination. In addition, the analog PLL is used for generating a timing clock for the determination. The signal processing for the CD or DVD is usually performed in an analog fashion and thus called an analog read channel. On the other hand, the signal processing method which is called PRML is introduced to determine data in recent digital recording devices such as the HDD. In the PRML, data is determined with digital values and the signal processing is also performed digitally, and thus it is called a digital read channel. In the digital read channel, the digital PLL is used for generating a timing clock for the discrimination.

Figure 15:
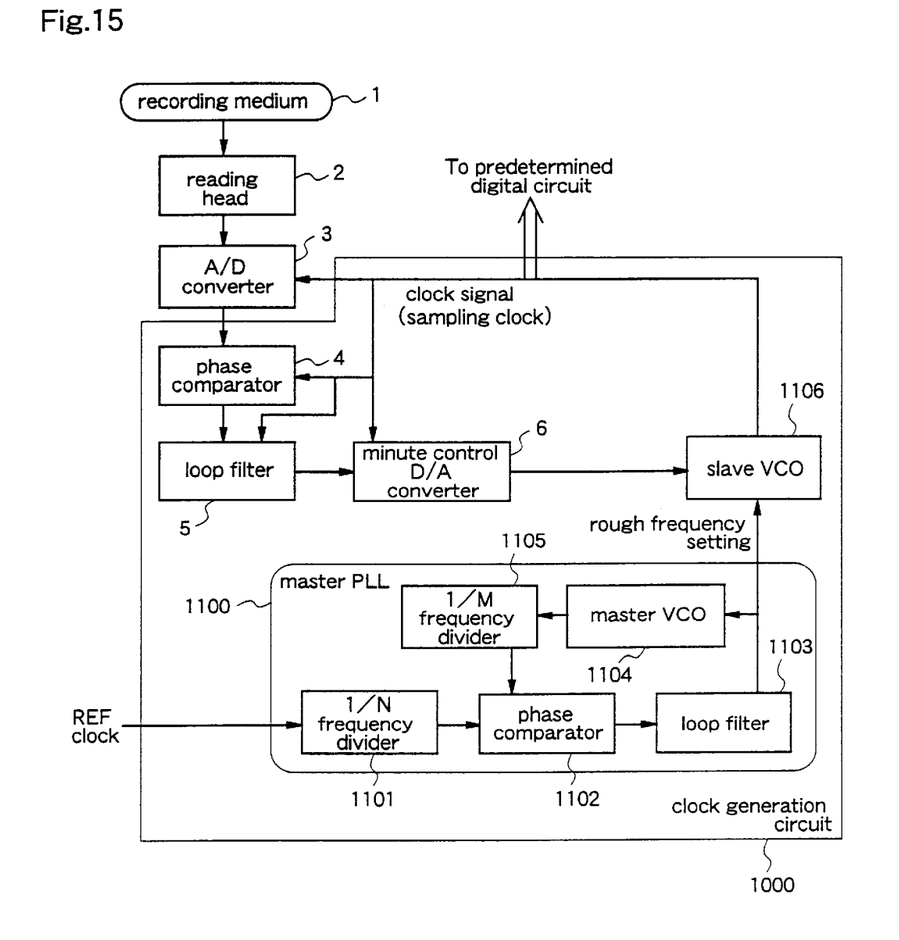
FIG. 15 is a block diagram illustrating a structure of a reproduction apparatus including a clock generation circuit 1000 according to a conventional digital PLL system.

The digital PLL which is used in the HDD or the like will be described as a prior art. FIG. 15 is a block diagram illustrating a structure of a reproduction apparatus including a clock generation circuit 1000 according to a conventional digital PLL system.

The clock generation circuit 1000 comprises a master PLL 1100, a phase comparator 4, a loop filter 5, a minute control D/A converter 6, and a slave VCO 1106. The master PLL 1100 comprises a 1/N frequency divider 1101, a phase comparator 1102, a loop filter 1103, a master VCO 1104, and a 1/M frequency divider 1105.

A reading head 2 reads an analog signal from a recording medium 1.

An A/D converter 3 converts the read analog signal into a digital signal in synchronization with a clock signal supplied by the clock generation circuit 1000, and outputs the digital signal to a reproduction circuit (not shown) which outputs digital data as a reproduction signal, and to the phase comparator 4 in the clock generation circuit 1000.

The phase comparator 4 extracts a phase error of the digital signal in synchronization with a sampling clock signal generated by the clock generation circuit 1000, and outputs the phase error to the loop filter 5.

The loop filter 5 filters the phase error to convert the same into a digital oscillation instruction signal, and outputs the signal to the minute control D/A converter 6.

The minute control D/A converter 6 converts the digital oscillation instruction signal into an analog oscillation instruction signal of an analog voltage proportional to the digital oscillation instruction signal, and outputs the analog signal to the slave VCO 1106.

The slave VCO 1106 has a wide oscillation range and its setting of an oscillation frequency is controlled in two steps, so as to generate a clock which is completely locked. That is, the master PLL 1100 sets a rough frequency of the oscillation range of the slave VCO 1106 and the minute control D/A converter 6 performs a fine adjustment of the frequency.

The 1/N frequency divider 1101 frequency-divides a REF clock by N and the phase comparator 1102 matches phases of the 1/N-frequency REF clock and a signal which is frequency-divided by M with the 1/M frequency divider 1105 with each other, thereby constituting a PLL synthesizer. The 1/M frequency divider 1105 frequency-divides a signal output from the master VCO 1104, by M.

The loop filter 1103 filters a signal output from the phase comparator 1102, and outputs the signal to the master VCO 1104 and to the slave VCO 1106.

In the HDD, the disk rotating speed is fixed and the closer to the perimeter, the higher the linear velocity is. In order to increase the liner recording density in this situation, a method which is called "zone bit recording" is used for the HDD. The zone bit recording is a method for dividing a disk into several zones and recording data with varying recording rates. That is, since the recording rate is higher at an outer zone and lower at an inner zone, the center frequency of the clock signal which is output from the clock generation circuit should be changed according to zones. Accordingly, the master PLL 1100 changes the parameters of N and M, controls the oscillation frequency of the master VCO 1104, and sets the center frequency of the slave VCO 1106.

That is, the master PLL 1101 roughly sets the oscillation frequency of the slave VCO 1106 to a frequency which is near the center frequency of a signal which is to be reproduced (rough control), and generates a clock which is completely locked to the reproduction signal with the minute control D/A converter 6 (minute control).

In addition, Japanese Published Patent Application No. Hei. 7-78422 discloses a clock extraction circuit which creates a phase error signal from digital data after performing the AD conversion, by using a delay line.

However, the conventional digital PLL system cannot executes the PLL continuously at a switching point of the rough control.

The conventional digital PLL system has no problem when reading data which is zone-bit-recorded at CAV (constant angular velocity), at CAV, like the HDD. However, in the CAV reproduction of reading data which is recorded at CLV (constant linear velocity), at CAV or the jitter-free reproduction of reading data before the spindle has the speed of CLV, like optical disks such as the DVD, the center frequency of the reproduction signal is continuously changed. Therefore, the PLL is required to continuously follow the frequency within a center frequency changing range. However, the conventional digital PLL cannot follow the frequency continuously. That is, in the conventional digital PLL system, the switching point of the rough control is a discontinuous point and thus the continuity of the PLL cannot be maintained.

In the conventional digital PLL system, the division ratios N and M of the synthesizer should be changed at the rough adjustment of the frequency. When N and M are changed, it is difficult to switch the parameters of N and M at the same timing. Besides, even when the parameters of N and M can be switched simultaneously, the center frequency is largely shifted at the switching as well as the continuity of the oscillation phase is lost. As a result of the shifting of the center frequency at the rough adjustment switching, the control cannot be executed by the PLL for performing the minute adjustment, whereby the phase lock is taken off. When the phase lock is taken off, a clock cannot be generated and thereby data cannot be reproduced either.

As described above, even when the conventional digital PLL used for the HDD is applied to optical disks such as the DVD, it cannot execute the PLL continuously to the wide frequency range which is required for the CAV reproduction or the CLV jitter-free reproduction.

The present invention is made to solve the above problems and it is an object of the present invention to provide a clock generation circuit which can lock a wide frequency range continuously.

DISCLOSURE OF THE INVENTION

In order to attain the above object, a clock generation circuit according to the present invention comprises a following construction:

A clock generation circuit for generating a clock signal which is used for reproducing a signal from a recording medium, comprises a phase comparator for extracting a phase error signal from a digital signal which is obtained by converting an analog signal which is read from the recording medium; a loop filter for filtering the phase error signal; a minute control D/A converter for converting the signal filtered by the loop filter, into an analog signal; a range detector for detecting whether the signal filtered by the loop filter is above, below, or within a preset range; a modulation reference signal generator for generating a modulation reference signal when the signal filtered by the loop filter is above or below the range; a pulse width modulator for converting the modulation reference signal into a pulse train; an adder for adding a predetermined frequency set value and the signal converted by the pulse width modulator; a rough control D/A converter for converting a signal obtained by the adder, into an analog signal; a low-pass filter for cutting high-band components of the analog signal which is converted by the rough control D/A converter; an analog adder for adding the analog signal which is output from the minute control D/A converter, and the analog signal which passed the low-pass filter; and a voltage controlled oscillator for generating a clock signal at a frequency proportional to the signal which is obtained by the analog adder when the range detector detects that the signal filtered by the loop filter is above or below the range, and generating a clock signal at a frequency proportional to the signal which is obtained by the minute control D/A converter when the range detector detects that the signal filtered by the loop filter is within the range.

The pulse width modulator is constituted by delta sigma modulation.

According to the clock generation circuit of the present invention, the input overrange of the minute control D/A converter is detected by the range detector, the modulation reference signal is generated, and the pulse width modulation processing is performed, whereby the input voltage of the voltage controlled oscillator can be controlled more than the resolution of the rough control D/A converter. Even when the input range of the minute control D/A converter almost exceeds the preset range and the rough control D/A converter is changed, the present invention provides a clock generation circuit which can continuously perform good clock generation without PLL being taken off and continuously lock a wide frequency range, and provides a clock generation circuit which can continuously perform clock reproduction over all controllable frequency region.

In addition, a clock generation circuit according to the present invention comprises a following construction:

A clock generation circuit for generating a clock signal which is used for reproducing a signal from a recording medium, comprises a phase comparator for extracting a phase error signal from a digital signal which is obtained by converting an analog signal which is read from the recording medium; a loop filter for filtering the phase error signal; an oversampler for zero-pad oversampling the signal filtered by the loop filter; an interpolator for interpolating data which is zero-pad oversampled by the oversampler; a multivalued delta sigma modulator for converting the signal interpolated by the interpolator, into a multivalued delta sigma modulation signal; a rough control D/A converter for converting the multivalued delta sigma modulation signal, into an analog signal; a low-pass filter for cutting high-band components of the analog signal which is output from the rough control D/A converter; and a voltage controlled oscillator for outputting a clock signal at a frequency proportional to the signal which passed the low-pass filter.

Therefore, according to the present invention, the loop filter signal is zero-pad oversampled, interpolated, and further multivalued delta sigma modulated, whereby the input voltage of the voltage controlled oscillator can be controlled more than the resolution of the rough control D/A converter. Consequently, a clock generation circuit which continuously locks a wide frequency range can be provided. Further, the minute control D/A converter is not required and only the rough control D/A converter is provided, whereby the structure is simplified.

Further according to the present invention, the modulation signal which changes smoothly and stably can be output from the pulse width modulator or the multivalued delta sigma modulator.

BEST MODE FOR CARRYING OUT THE INVENTION

Embodiment 1

Hereinafter, a clock generation circuit according to a first embodiment of the present invention will be described with reference to the drawings. Here, the same reference numerals as those in FIG. 15 designate the same or corresponding parts.

Figure 1:
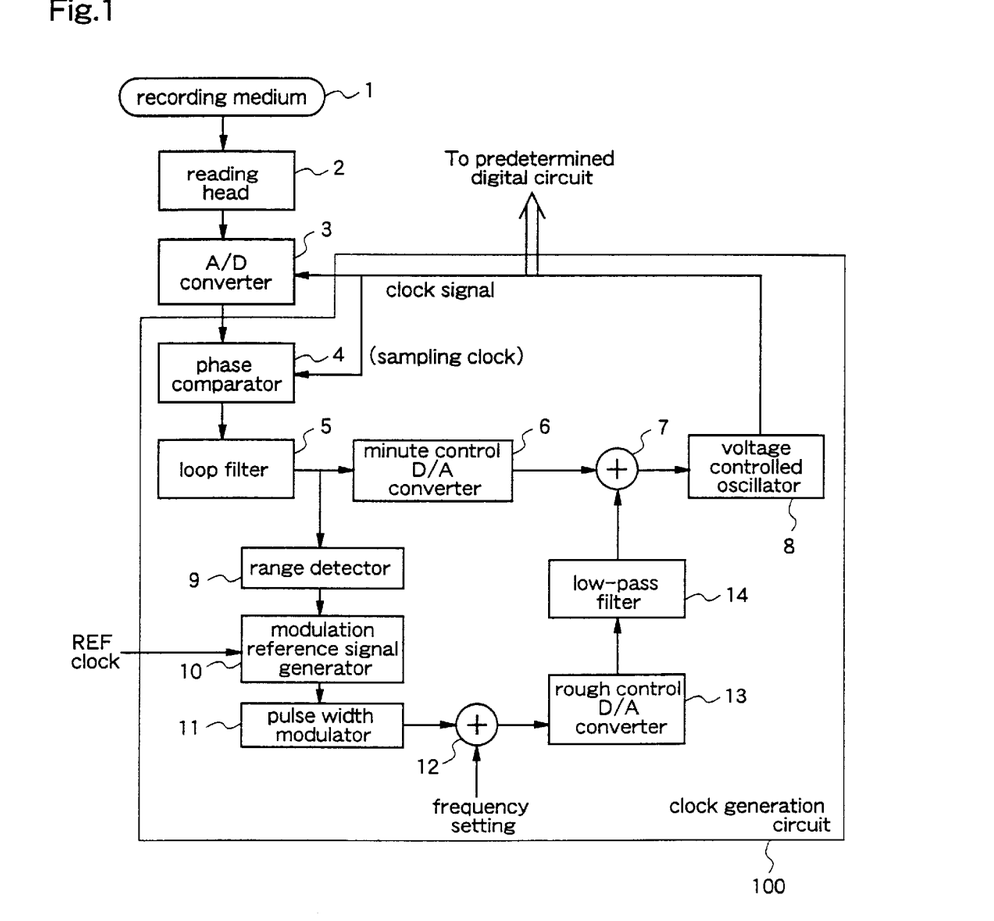
FIG. 1 is a block diagram illustrating a structure of an apparatus for reproducing a recording medium 1, which includes a clock generation circuit 100 according to a first embodiment.

FIG. 1 is a block diagram illustrating apart of an apparatus for reproducing a recording medium 1, which includes a clock generation circuit 100 according to the first embodiment.

The clock generation circuit 100 comprises a phase comparator 4, a loop filter 5, a minute control D/A converter 6, an analog adder 7, a voltage controlled oscillator 8, a range detector 9, a modulation reference signal generator 10, a pulse width modulator 11, an adder 12, a rough control D/A converter 13, and a low-pass filter 14.

A reading head 2 detects an analog reproduction signal from the recording medium 1, and outputs the signal to an A/D converter 3.

In synchronization with a clock signal supplied by the clock generation circuit 100, the A/D converter 3 samples the analog reproduction signal to convert the same into a digital reproduction signal, and outputs the digital reproduction signal to a reproduction circuit (not shown) which generates a reproduction signal on the basis of the digital reproduction signal and outputs the reproduction signal, and to the phase comparator 4 in the clock generation circuit 100.

The phase comparator 4 extracts a phase error signal from the digital reproduction signal which is sampled at a timing of the clock signal, and outputs the phase error signal to the loop filter 5.

The loop filter 5 is constituted by addition of a complete integral component and a proportional component, and it filters the phase error signal and outputs the filtered phase error signal to the minute control D/A converter 6 and to the range detector 9.

The minute control D/A converter 6 is a D/A converter for controlling an oscillation frequency minutely on the basis of the phase error, and it converts the input signal into an analog signal and outputs the analog signal to the analog adder 7.

The range detector 9 has a function of detecting whether the signal filtered by the loop filter 5 is within an input range of the minute control D/A converter 6, and it outputs a detection result to the modulation reference signal generator 10.

The modulation reference signal generator 10 and the pulse width modulator 11 control changes in a LSB (Least Significant Bit) of the rough control D/A converter 13, and perform a signal processing for smoothing changes in an input voltage which is finally input to the voltage controlled oscillator 8. The modulation reference signal generator 10 generates a modulation reference signal by an up down counter (described later), and the pulse width modulator 11 subjects the modulation reference signal to delta sigma modulation, thereby obtaining a pulse width modulated signal.

The output from the pulse width modulator 11 is input to the adder 12, and the adder 12 generates an input signal to the rough control D/A converter 13 by adding the pulse width modulated output and a frequency set value which is previously set.

The rough control D/A converter 13 is a D/A converter for performing a rough frequency control, and the rough control D/A converter 13 converts the output of the digital adder 12 into an analog signal and outputs the analog signal to the low-pass filter 14.

The low-pass filter 14 removes high-band components of the input analog signal, and outputs the signal to the analog adder 7.

The analog adder 7 adds the output of the low-pass filter 14 and the output of the minute control D/A converter 6, and outputs the result to the voltage controlled oscillator 8.

The voltage controlled oscillator 8 oscillates a frequency proportional to the input voltage. The output of the voltage controlled oscillator 8 is supplied as a clock signal to the A/D converter 3 as well as to other A/D converters and D/A converters, and all digital circuits requiring a clock signal.

Next, the phase comparator 4 will be described with reference to FIGS. 2 to 4.

Figure 2:
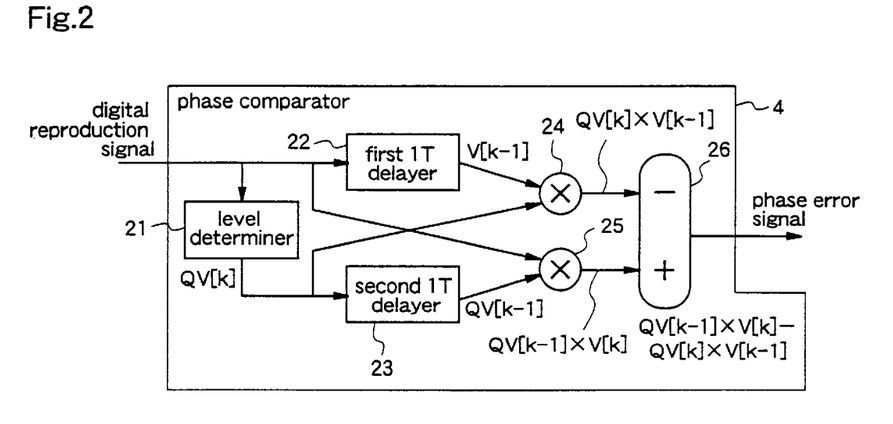
FIG. 2 is a block diagram illustrating a structure of a phase comparator 4.

FIG. 2 is a block diagram illustrating a structure of the phase comparator 4.

The phase comparator 4 comprises a level determiner 21, a first 1T delayer 22, a second 1T delayer 23, a first multiplier 24, a second multiplier 25, and a subtracter 26.

The digital reproduction signal input to the phase comparator 4 is input to the first 1T delayer 22, the second multiplier 25, and the level determiner 21.

The first and second 1T delayers 22 and 23 perform delaying by 1 sampling clock time (hereinafter referred to as 1T).

The level determiner 21 performs level determination according to types of partial response, and outputs a level determination signal QV[k] to the second 1T delayer 23 and the first multiplier 24.

The first multiplier 24 performs multiplication of a 1T-delayed digital reproduction signal V[k−1] and the level determination signal QV[k], and outputs the result QV[k]*V[k−1].

The second multiplier 25 performs multiplication of a 1T-delayed level determination signal QV[k−1] and the digital reproduction signal V[k], and outputs the result QV[k−1]*V[k].

The outputs from the first and the second multipliers 24 and 25 are input to the subtracter 26, and the subtracter 26 obtains a phase error signal QV[k−1]*V[k]−QV[k]*V[k−1] and outputs the phase error signal.

Figure 3:
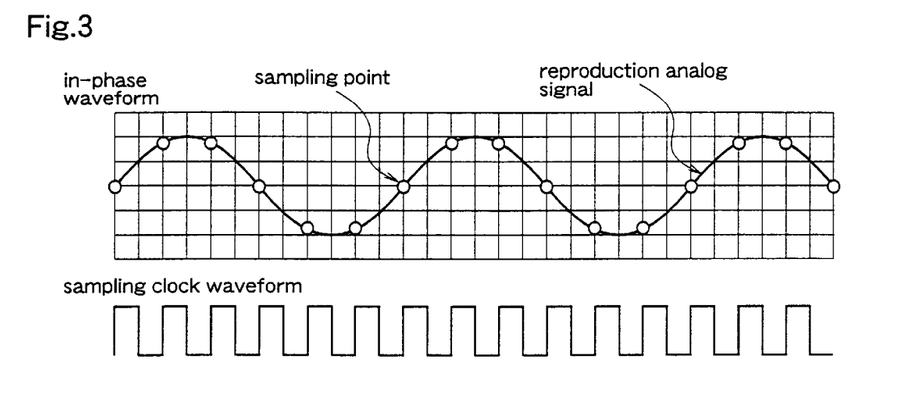
FIG. 3 is a diagram showing a sampling waveform and a sampling clock waveform when they are in phase.
Figure 4:
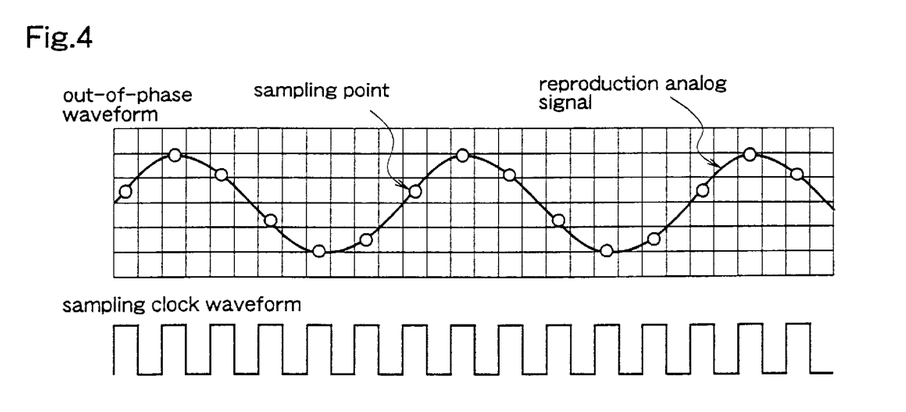
FIG. 4 is a diagram showing a sampling waveform and a sampling clock waveform when they are out of phase.

FIGS. 3 and 4 are diagrams showing signal waveforms for explaining phase error detection algorithm in the phase comparator 4.

FIG. 3 is a diagram showing a sampling waveform and a sampling clock waveform when they are in phase.

The A/D converter 3 samples the reproduction analog signal at a timing of the clock signal. Therefore, when the reproduction analog signal is in phase, a point where a value supplied by the A/D converter 3 is changed from positive to negative or from negative to positive (zero cross point) matches a sampling point. The fundamental principle of the phase error is to detect the amount of a shift between the sampling point which is normally at the zero cross point and the zero cross point. When they are in phase as shown in FIG. 3, the phase error is zero.

FIG. 4 is a diagram showing a sampling waveform and a sampling clock waveform when they are out of phase.

When they are out of phase, the sampling point is shifted from the zero cross point. The phase error is a shift between the sampling point and the zero cross point, which is obtained by using the above-described level determination value.

Figure 5:
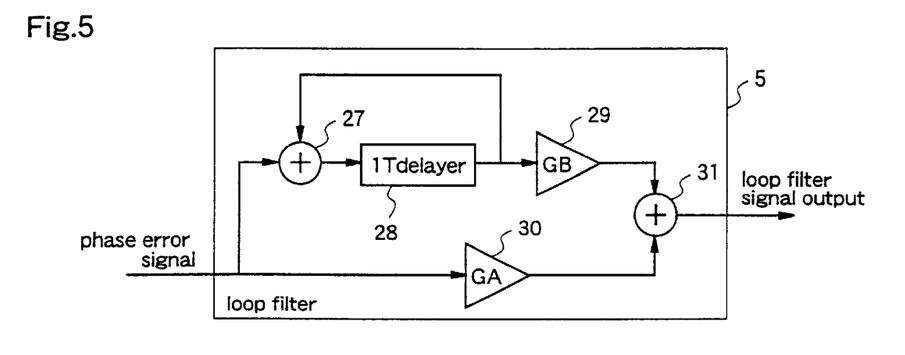
FIG. 5 is a block diagram illustrating a structure of a loop filter 5.

FIG. 5 is a block diagram illustrating a structure of a loop filter 5.

The loop filter 5 comprises a first adder 27, a 1T delayer 28, a first coefficient multiplier (GB) 29, a second coefficient multiplier (GA) 30, and a second adder 31.

The phase error signal input to the loop filter 5 is input to the second coefficient multiplier 30 and the first adder 27.

The first adder 27 adds the input phase error signal and a 1T-delayed signal output from the 1T delayer 28.

The 1T delayer 28 1T-delays a signal output from the adder 27 and output the 1T-delayed signal to the first coefficient multiplier 29 and the first adder 27.

The loop filter 5 performs addition of complete integral series and proportional series of the phase error signal. That is, the first coefficient multiplier 29 sets a gain of the complete integral series and the second coefficient multiplier 30 sets a gain of the proportional series.

The second adder 31 adds outputs of the first and second coefficient multipliers 29 and 30, and outputs a loop filter signal.

Since the output of the loop filter 5 includes an added component of the complete integral series, the output has theoretically infinite assumable values and when a prescribed error signal is continuously output, the output of the loop filter 5 is continuously increased. But in reality, the resolution of the minute control D/A converter 6 which outputs the phase error is limited and usually about 8 bits, for example. Assuming that about 8 bits are assigned to the minute control, the frequency control range is about ±5%.

Figure 6:
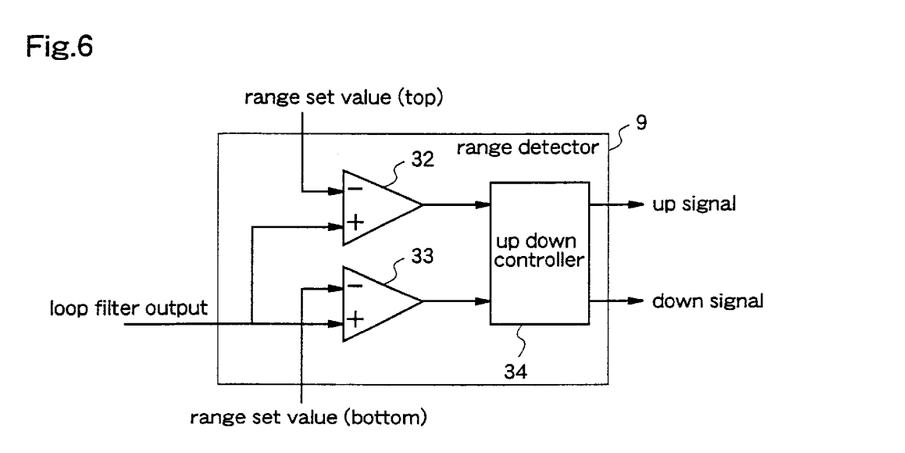
FIG. 6 is a block diagram illustrating a structure of a range detector 9.

FIG. 6 is a block diagram illustrating a structure of the range detector 9.

The range detector 9 comprises first and second comparators 32 and 32 and an up down controller 34.

The loop filter signal input to the range detector 9 is input to the first and second comparators 32 and 33.

The first comparator 32 compares a top of a range set value which is previously set, with the loop filter signal and inputs a comparison result to the up down controller 34.

The second comparator 33 compares a bottom of the range set value which is previously set, with the loop filter signal and inputs a comparison result to the up down controller 34.

The up down controller 34 generates an up signal or a down signal on the basis of the input comparison result, and outputs the signal to the modulation reference signal generator 10.

Here, the set values of the top range and the bottom range are set so that the output of the loop filter 5 indicates a range in which a clock signal is generated by the minute control D/A converter 6 without utilizing the control of the rough control D/A converter 13.

Figure 7:
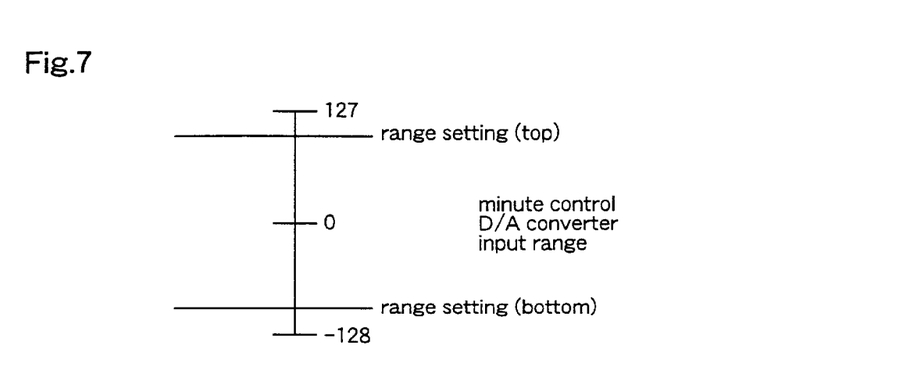
FIG. 7 is a diagram exemplifying a concept of a range of the range detector 9.

FIG. 7 is a diagram exemplifying a concept of the range of the range detector 9.

In FIG. 7, assume that the resolution of the minute control D/A converter 6 is 8 bits and the input range of the minute control D/A converter 6 is from −128 to 127. In addition, the top and bottom values are previously set within the input range.

When the up down controller 34 receives a result indicating that the loop filter signal exceeds the top range set value, from the first comparator 32, it outputs an up signal. When it receives a result indicating that the loop filter signal is below the bottom range set value, from the second comparator 33, it outputs a down signal. When the comparison result from the first comparator 32 indicates that the loop filter signal is the top range set value or less and the comparison result from the second comparator 33 indicates that the loop filter signal is the bottom range set value or more, the up down controller 34 does not operate. Accordingly, respective elements from the modulation reference signal generator 10 to the low-pass filter 14 do not operate either. In this case, the signal supplied to the voltage controlled oscillator 8 is a signal which is generated by the minute control D/A converter 6 on the basis of the output of the loop filter 5.

Figure 8:
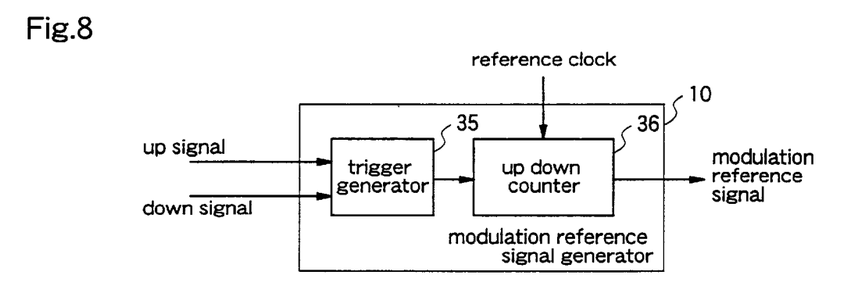
FIG. 8 is a block diagram illustrating a structure of a modulation reference signal generator 10.

FIG. 8 is a block diagram illustrating a structure of the modulation reference signal generator 10.

The up signal or down signal, which is output from the range detector 9, is input to a trigger generator 35.

Upon receipt of the up signal or down signal, the trigger generator 35 outputs a trigger signal to an up down counter 36.

When the up down counter 36 receives the trigger signal, it counts the input reference clocks upward or downward for a prescribed period, and generates the modulation reference signal on the basis of the counted reference clocks.

Figure 9:
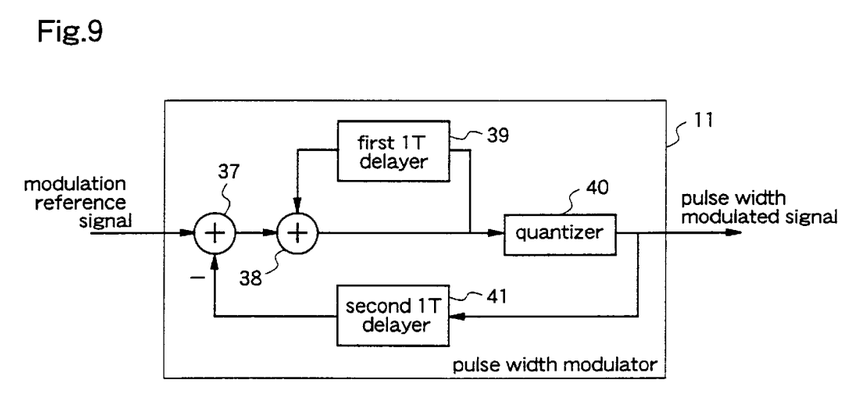
FIG. 9 is a block diagram illustrating a structure of a pulse width modulator 11.

FIG. 9 is a block diagram illustrating a structure of the pulse width modulator 11 using delta sigma modulation. Here, while various structures of the pulse width modulator can be supposed, the pulse width modulator according to the first embodiment performs pulse width modulation using the delta sigma modulation.

The pulse width modulator 11 comprises a subtracter 37, an adder 38, a first 1T delayer 39, a quantizer 40, and a second 1T delayer 41.

The demodulation reference signal output from the modulation reference signal generator 10 is input to the subtracter 37.

The subtracter 37 subtracts, from the modulation reference signal, a feedback signal which is obtained by 1T-delaying a signal of the quantizer 40 by the second 1T delayer 41.

The adder 38 adds a subtracted value which is output from the subtracter 37 and a feedback signal which is obtained by delaying an output of the adder 38 by the 1T delayer 39.

The quantizer 40 quantizes an added value output from the adder 38 into binary.

The modulation reference signal is converted into a pulse train by the above-described structure according to the delta sigma modulation.

Figure 10:
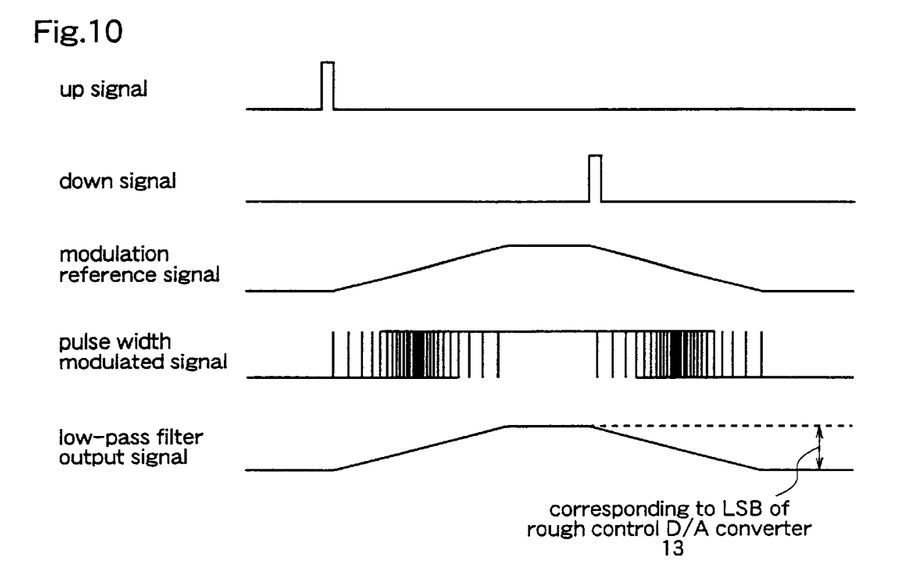
FIG. 10 is a diagram showing waveforms of respective outputs of the range detector 9, the modulation reference signal generator 10, the pulse width modulator 11, and a low-pass filter 14.

FIG. 10 is a diagram showing waveforms of respective outputs of the range detector 9, the modulation reference signal generator 10, the pulse width modulator 11, and the low-pass filter 14. This figure shows waveforms of the up signal output from the range detector 9, the down signal output from the range detector 9, the modulation reference signal output from the modulation reference signal generator 10, a modulated signal output from the pulse width modulator 11, a low-pass filter output signal output from the low-pass filter 14, respectively from the top.

As shown in FIG. 10, the low-pass filter output signal gradually changes the voltage with a resolution higher than 1 LSB of the resolution of the rough control D/A converter 13 and consequently reduces a time changing ratio of the voltage input to the voltage controlled oscillator 8.

When the time changing rate of the input voltage which is input to the voltage controlled oscillator 8 is not reduced, the oscillation frequency of the voltage controlled oscillator 8 is abruptly changed. Therefore, a loop constituted by the minute control D/A converter 6 cannot follow the frequency and thereby the PLL is taken off. Supposing that the rough control D/A converter 13 is directly incremented or decremented by the up signal or down signal which is output from the range detector 9, the voltage is changed by an amount corresponding to 1 LSB of the rough control D/A converter 13. Since the frequency is abruptly changed by an amount corresponding to 1 LSB of the rough control D/A converter 13, the loop constituted by the minute control D/A converter 6 cannot follow the oscillation frequency of the voltage controlled oscillator 8, whereby the PLL is taken off.

In the first embodiment, the modulation reference signal generator 10 and the pulse width modulator 11 are provided to avoid such an abrupt change in the frequency. Thereby, the voltage input to the voltage controlled oscillator 8 is controlled more than the resolution of the rough control D/A converter, and the time changing ratio of the input voltage of the voltage controlled oscillator 8 is reduced. Therefore, even when the range of the rough control D/A converter 13 is changed, excess from the input range of the minute control D/A converter 6 can be avoided, whereby good clocks can be continuously generated without the PLL taken off. In addition, a clock generation circuit which can continuously lock a wide frequency range can be provided and a clock generation circuit which can continuously perform the clock reproduction over all controllable frequency regions can be provided. Further, according to the first embodiment, the modulation signal which is changed smoothly and stably can be output from the pulse width modulator.

Embodiment 2

Figure 11:
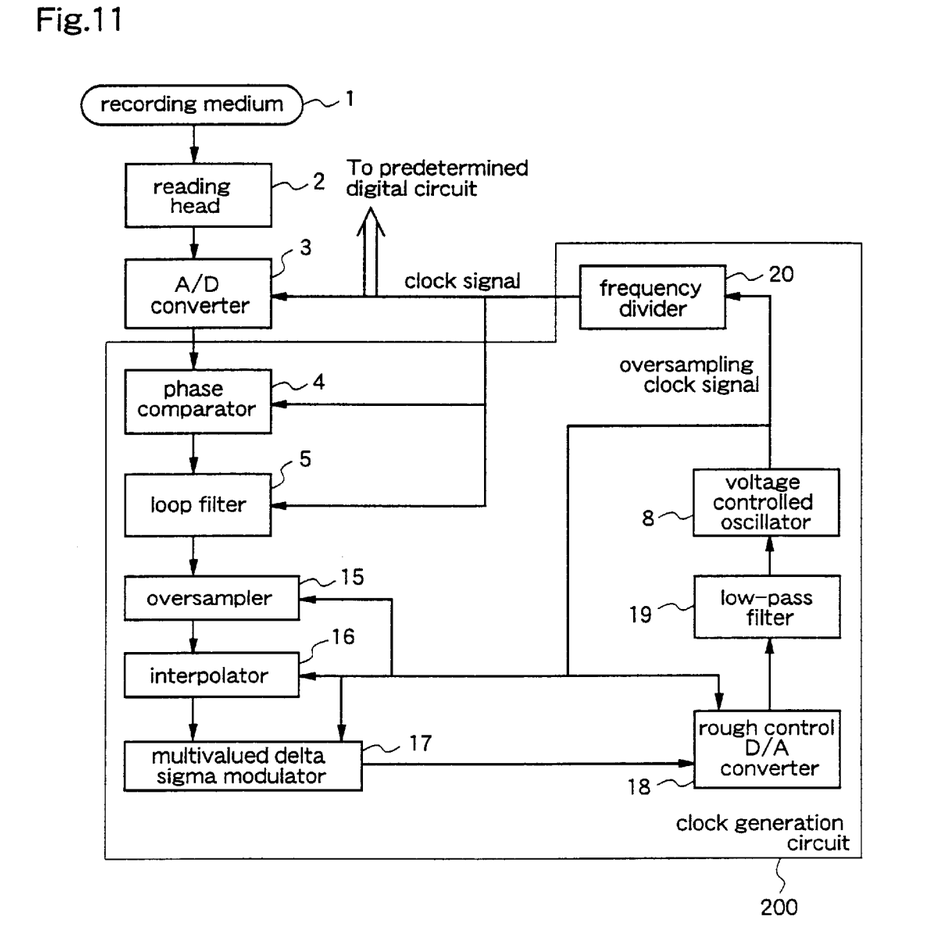
FIG. 11 is a block diagram illustrating a structure of an apparatus for reproducing a recording medium 1, which includes a clock generation circuit 200 according to a second embodiment.

FIG. 11 is a block diagram illustrating a structure of an apparatus for reproducing a recording medium 1, which includes a clock generation circuit 200 according to the second embodiment. The same reference numerals as those in FIG. 1 designate the same or corresponding parts.

A reading head 2 read a signal from the recording medium 1, and outputs the signal to an A/D converter 3.

The A/D converter 3 converts the analog reproduction signal into a digital reproduction signal on the basis of a clock signal which is output from a frequency divider 20 of the clock generation circuit 200.

The clock generation circuit 200 comprises a phase comparator 4, a loop filter 5, an oversampler 15, an interpolator 16, a multivalued delta sigma modulator 17, a rough control D/A converter 18, a low-pass filter 19, a voltage controlled oscillator 8, and a frequency divider 20. The oversampler 15, the interpolator 16, the multivalued delta sigma modulator 17, and the rough control D/A converter 18. constitute an over sampling system digital block.

The digital reproduction signal is input to the phase comparator 4 and the phase comparator 4 extracts a phase error signal from the digital reproduction signal which is sampled at a timing of the clock signal.

The loop filter 5 is constituted by addition of a complete integral component and a proportional component, and it filters the phase error obtained by the phase comparator 4.

The oversampler 15 subjects the phase error signal which is filtered by the loop filter 5 to zero-pad oversampling at a predetermined rate.

The interpolator 16 subjects an output of the oversampler 15 to interpolation processing. The interpolator 16 is constituted by a FIR (Finite Impulse Response) filter, and it performs Nyquist interpolation for zero-padded data. An output of the interpolator 16 is input to the multivalued delta sigma modulator 17.

The multivalued delta sigma modulator 17 generates a modulation signal corresponding to a quantizing resolution of the rough control D/A converter 18.

The rough control D/A converter 18 converts the modulation signal from the multivalued delta sigma converter 17, into an analog signal.

The low-pass filter 19 can be constituted by a primary analog filter, and it filters the analog signal from the rough control D/A converter 18.

The voltage controlled oscillator 8 outputs an oversampling clock signal on the basis of an output from the low-pass filter 19. The oversampling clock signal output from the voltage controlled oscillator 8 is input to the frequency divider 20, and the oversampler 15, the interpolator 16, the multivalued delta sigma modulator 17 and the rough control D/A converter 18, which are digital blocks of the oversampling system.

The A/D converter 3, the phase comparator 4, and the loop filter 5 have the same structures of those in the first embodiment.

Figure 12:
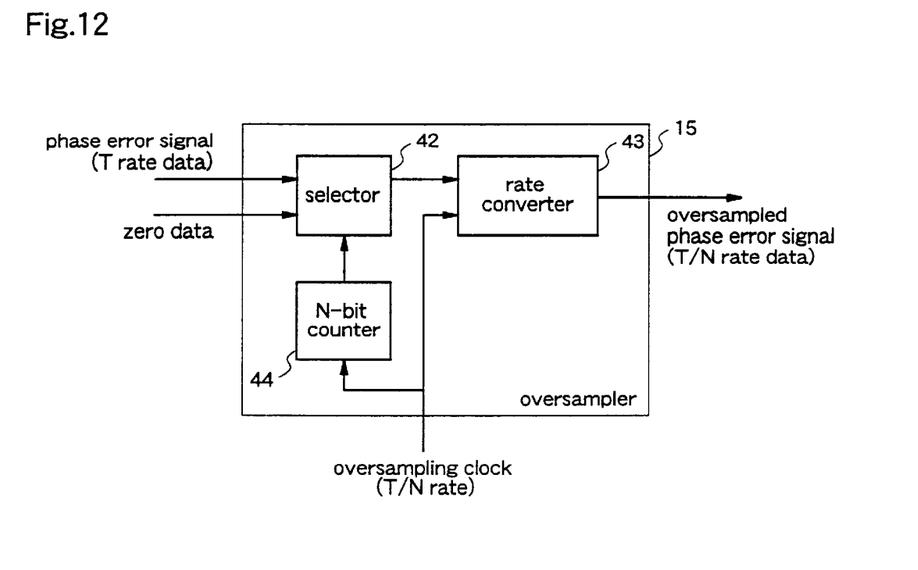
FIG. 12 is a block diagram illustrating a structure of an oversampler 15.

FIG. 12 is a block diagram illustrating a structure of the oversampler 15.

The oversampler 15 comprises a selector 42, an N-bit counter 44, and a rate converter 43.

The T rate phase error signal output from the loop filter 5, zero data, and a select signal output from the N-bit counter 44 are input to the selector 42. "N" of the N-bit counter 44. represents an oversampling ratio, and the counter 44 generates the select signal on the basis of the oversampling ratio N and controls the timing of signal selection in the selector 42. The selector 42 subjects the phase error signal to the zero-pad oversampling on the basis of the select signal of the N-bit counter 44. For example, when N=4, a data sequence is obtained as follows:

data1, 0, 0, 0, data2, 0, 0, 0, data3, 0, 0, 0, . . .

The rate converter 43 latches the output of the selector 42, i.e., zero-padded data with an oversample clock, and outputs an oversampled phase error signal.

Figure 13:
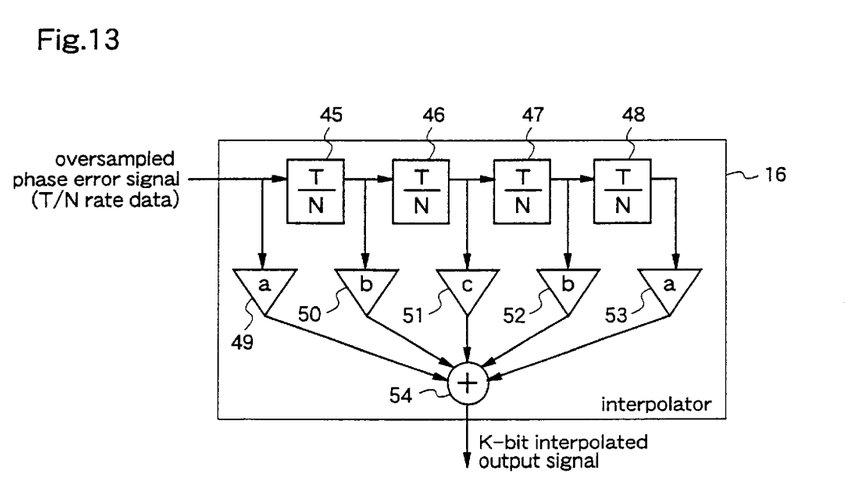
FIG. 13 is a block diagram illustrating a structure of an interpolator 16.

FIG. 13 is a block diagram illustrating a structure of the interpolator 16.

The interpolator 16 comprises four T/N-delayers 45, 46, 47 and 48, and five multipliers 49, 50, 51, 52 and 53. Here, the numbers of the T/N-delayers and the multipliers are not limited to the above numbers.

The oversampled phase error signal output from the oversampler 15 is input to the first T/N-delayer 45 and the first multiplier 49. An output of the first T/N-delayer 45 is input to the second T/N-delayer 46 and the second multiplier 50. An output of the second T/N-delayer 46 is input to the third T/N-delayer 47 and the third multiplier 51. An output of the third T/N-delayer 47 is input to the fourth T/N-delayer 48 and the fourth multiplier 52. An output of the fourth T/N-delayer 48 is input to the fifth multiplier 53. Outputs of the first to fifth multipliers 49, 50, 51, 52 and 53 are input to an adder 54 and output from the adder 54 as a K-bit interpolated output signal. "K" represents the number of bits in data output from the adder 54.

Here, multiplication coefficient "a" of the first and fifth multipliers 49 and 53, multiplication coefficients "b" of the second and fourth multipliers 50 and 52, and a multiplication coefficient "c" of the third multiplier 51 are Nyquist interpolation constants, respectively, and they are given by the following formulas, for example:

$$a = \sin(\pi/(2*N))/(\pi/(2*N))$$

$$b = \sin(\pi/(1*N))/(\pi/(1*N))$$

$$c = 1$$

Figure 14:
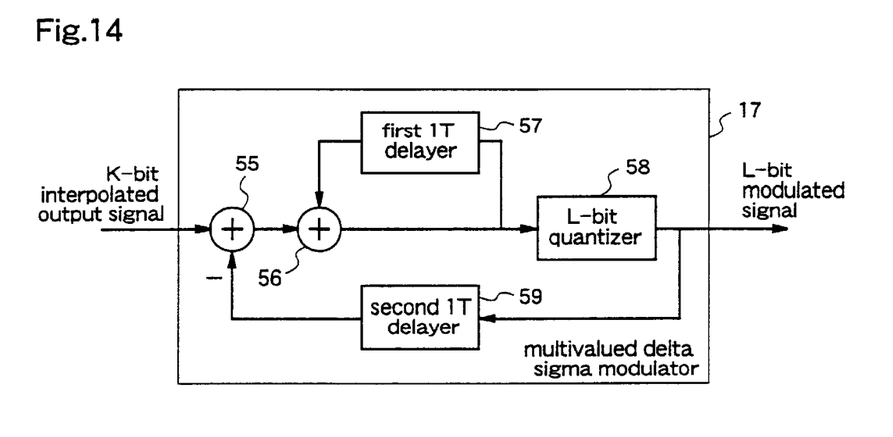
FIG. 14 is a block diagram illustrating a structure of a multivalued delta sigma modulator 17.

FIG. 14 is a block diagram illustrating a structure of the multivalued delta sigma modulator 17.

The multivalued delta sigma modulator 17 comprises a subtracter 55, an adder 56, a first 1T delayer 57, an L-bit quantizer 58, and a second 1T delayer 59.

The subtracter 55 subtracts a feedback signal which is obtained by delaying a L-bit modulated signal by the second 1T delayer 59, from the K-bit interpolated output signal which is output from the interpolator 16.

The adder 56 adds an output of the subtracter 55 and a feedback signal which is obtained by delaying an output of the adder 56 by the first 1T delayer 57. The output of the adder 56 is input to the L-bit quantizer 58 and the first 1T delayer 57.

The L-bit quantizer 58 quantizes the output of the adder 56, i.e., the K-bit modulation reference signal, into L bits by delta sigma modulation. Here, the relationship between K and L is given by K>L. For example, when the rough control D/A converter 18 to which the multivalued delta sigma modulator 17 is connected has an 8-bit solution, L=8. In this case, an output signal output from the interpolator 16 has 9 bits or more. The limiting proportion of L to K is decided by the relationship between an oversampling frequency and a control band.

In this second embodiment, the output of the loop filter 5 is oversampled by the oversampler 15, and the K-bit interpolated output which is interpolated by the interpolator 16 is changed into an L-bit signal by the multivalued delta sigma modulator 17. Therefore, the input voltage of the voltage controlled oscillator 8 can be controlled more than the resolution of the rough control D/A converter 18, whereby a good clock generation circuit having a wide frequency pulling range can be realized using the D/A converter having a rough resolution. Further, according to the second embodiment, the modulation signal which is changed smoothly and stably can be output from the multivalued delta sigma modulator.

INDUSTRIAL AVAILABILITY

The present invention can be used as a clock generation circuit for generating a clock signal which is used as a data reproduction signal in a digital recording and reproducing apparatus.

What is claimed is:

1. A clock generation circuit for generating a clock signal which is used for reproducing a signal from a recording medium, comprising:
   a phase comparator for extracting a phase error signal from a digital signal which is obtained by converting an analog signal which is read from the recording medium;
   a loop filter for filtering the phase error signal;
   a minute control D/A converter for converting the signal filtered by the loop filter, into an analog signal;
   a range detector for detecting whether the signal filtered by the loop filter is above, below, or within a preset range;
   a modulation reference signal generator for generating a modulation reference signal when the signal filtered by the loop filter is above or below the range;
   a pulse width modulator for converting the modulation reference signal into a pulse train;
   an adder for adding a predetermined frequency set value and the signal converted by the pulse width modulator;
   a rough control D/A converter for converting a signal obtained by the adder, into an analog signal;
   a low-pass filter for cutting high-band components of the analog signal which is converted by the rough control D/A converter;
   an analog adder for adding the analog signal which is output from the minute control D/A converter, and the analog signal which passed the low-pass filter; and
   a voltage controlled oscillator for generating a clock signal at a frequency proportional to the signal which is obtained by the analog adder when the range detector detects that the signal filtered by the loop filter is above or below the range, and generating a clock signal at a frequency proportional to the signal which is obtained by the minute control D/A converter when the range detector detects that the signal filtered by the loop filter is within the range.

2. The clock generation circuit of claim 1 wherein the pulse width modulator is constituted by delta sigma modulation.

3. A clock generation circuit for generating a clock signal which is used for reproducing a signal from a recording medium, comprising:
   a phase comparator for extracting a phase error signal from a digital signal which is obtained by converting an analog signal which is read from the recording medium;
   a loop filter for filtering the phase error signal;
   an oversampler for zero-pad oversampling the signal filtered by the loop filter;
   an interpolator for interpolating data which is zero-pad oversampled by the oversampler;
   a multivalued delta sigma modulator for converting the signal interpolated by the interpolator, into a multivalued delta sigma modulation signal;
   a rough control D/A converter for converting the multivalued delta sigma modulation signal, into an analog signal;
   a low-pass filter for cutting high-band components of the analog signal which is output from the rough control D/A converter; and
   a voltage controlled oscillator for outputting a clock signal at a frequency proportional to the signal which passed the low-pass filter.

\* \* \* \* \*